United States Patent
Yang

(10) Patent No.: US 7,015,405 B2
(45) Date of Patent: Mar. 21, 2006

(54) PANEL DEVICE FOR ATCA MAIN BOARD

(75) Inventor: Chih-Wei Yang, Taipei (TW)

(73) Assignee: Portwell Inc., Taipei (TW)

( * ) Notice: Subject to any disclaimer, the term of this patent is extended or adjusted under 35 U.S.C. 154(b) by 0 days.

(21) Appl. No.: 10/912,967

(22) Filed: Aug. 6, 2004

(65) Prior Publication Data
US 2005/0274592 A1 Dec. 15, 2005

(30) Foreign Application Priority Data
Jun. 11, 2004 (TW) .............................. 93209330 U

(51) Int. Cl.
H01H 3/16 (2006.01)
(52) U.S. Cl. .................... 200/61.73; 200/296
(58) Field of Classification Search ............ 200/61.73, 200/296, 50.14, 50.17, 50.18, 50.1, 750.18; 439/157, 160, 911
See application file for complete search history.

(56) References Cited
U.S. PATENT DOCUMENTS
5,191,970 A * 3/1993 Brockway et al. .......... 200/335
5,535,099 A * 7/1996 McCarthy et al. .......... 361/800
5,949,652 A * 9/1999 McAnally et al. .......... 361/726
6,381,146 B1 * 4/2002 Sevier ........................ 361/754
6,916,190 B1 * 7/2005 Joist ........................... 439/160
2002/0104396 A1 * 8/2002 Megason et al. ............. 74/109
2005/0014403 A1 * 1/2005 Joist ........................... 439/157

* cited by examiner

Primary Examiner—Michael Friedhofer
Assistant Examiner—Lisa Klaus
(74) Attorney, Agent, or Firm—Scully, Scott, Murphy & Presser

(57) ABSTRACT

A panel device for contacting with a switch on an ATCA main board in a case comprises a faceplate having openings and a pole, two first fasteners for securing the faceplate to the case, and a first arm pivotally connected to the faceplate. The first arm has a first finger passing through the opening to be coupled with the switch, a first ear for being touched by the case to swivel the first arm in order to make the first finger contact with the switch, and a lug with a second fastener to fix the first arm to the pole on the faceplate so that there is no possibility for the first finger to escape from the switch.

4 Claims, 3 Drawing Sheets

PANEL DEVICE FOR ATCA MAIN BOARD

FIELD OF THE INVENTION

The present invention relates generally to a panel device for a main board used in the respect of advanced telecom computing architecture (ATCA), and more particularly to a panel device with an arm which can be firmly coupled with a switch on the main board.

BACKGROUND OF THE INVENTION

With continuous development in communication technology, the speed about processing communication signals has advanced from mega bytes to giga bytes. Therefore, the operating features of an ATCA main board used for high process speed are strictly requested.

As shown in FIG. 1, a conventional panel device 1 for ATCA main board 2 comprises a faceplate 11, two arms 12 pivotally connected at two ends of the faceplate 11, and two threaded fasteners 13 respectively near the two arms 12. Because the faceplate 11 is fixed to the ATCA main board 2, when the main board 2 is pushed into a case 3 through a chamber 31, an ear 121 of each arm 12 will be touched by an edge 32, near the chamber 31, of the case 3 to swivel the arm 12. Then, a finger 122 of each arm 12 will penetrate through an opening 111 in the faceplate 11 to actuate a switch 21 provided on the main board 2 so as to start the operation in the ATCA main board. Finally, the faceplate 11 is fixed to the case 3 by two fasteners 13 respectively threaded into two holes 321 in the case 3.

However, the conventional panel device 1 only focuses on the fixation between the faceplate 11 and the case 3, but neglects that between the arm 12 and the faceplate 11. Hence, the finger 122 of the arm 12 may incidentally escape from the switch 21 on the main board 2 due to vibration or unexpected human interference, which results in abnormal or unsteady operations.

SUMMARY OF THE INVENTION

Accordingly, the present invention relates to a panel device that can substantially obviate one or more of the problems due to the limitations and disadvantages of the related arts.

One object of the present invention is to provide a panel device which can be firmly coupled with a switch on the ATCA main board.

Another object of the present invention is to provide a panel device which can promote the operation stability of the ATCA main board.

Additional features and advantages of the invention will be set forth in the description which follows, and in portion will be apparent from the description, or may be learned by practice of the invention. The objectives and advantages of the invention will be realized and attained by the structure particularly pointed out in the written description and claims hereof as well as the appended drawings.

To achieve these and other advantages and according to the purpose of the present invention, as embodied and broadly described, a panel device for contacting with a switch on a board in a case, the panel device comprising: a faceplate having a pole and two openings; two first fasteners for securing the faceplate to the case; a first arm pivotally connected to the faceplate, and having a first finger passing through one of the openings to contact with the switch, and having a lug with a second fastener to fix the first arm on the pole; and a second arm pivotally connected to the faceplate and having a second finger.

It is preferred that the first arm further having a first ear for being touched by the case to swivel the first arm in order to make the first finger contact with the switch.

It is preferred that the second arm has a second ear passing the other opening.

It is preferred that the faceplate further has magnets for holding the first arm and the second arm in place.

BRIEF DESCRIPTION OF THE DRAWINGS

The accompanying drawings, which are included to provide a further understanding of the invention and are incorporated in and constitute a portion of the specification, illustrate embodiments of the invention and together with the description serve to explain the principle of the invention. In the drawings.

DETAILED DESCRIPTION OF THE INVENTION

Figure 2:
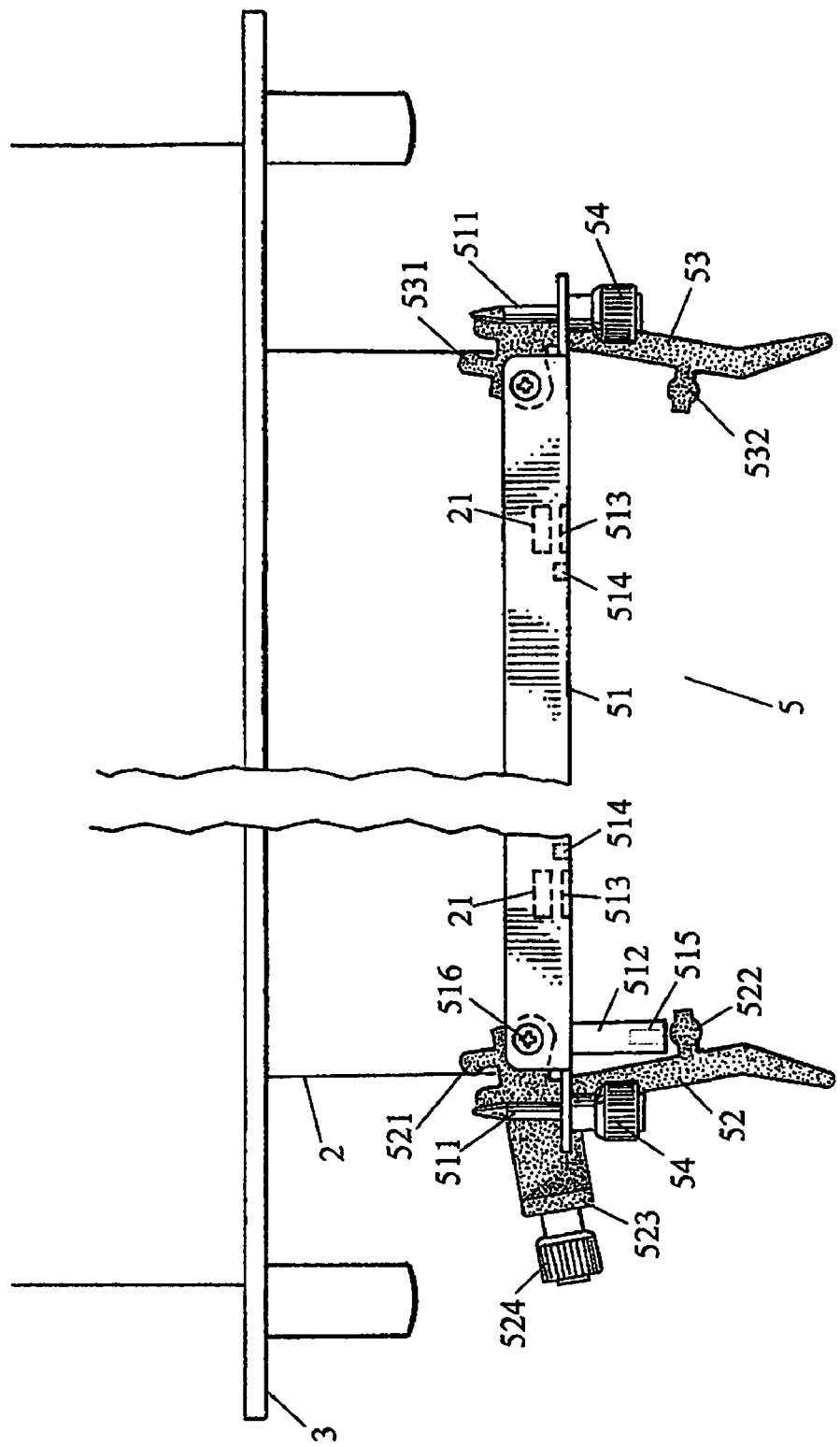
FIG. 2 is a top plane view illustrating a panel device according to the present invention fixed to an ATCA main board which is mounted in a case, wherein the arm is not coupled with the switch.
Figure 3:
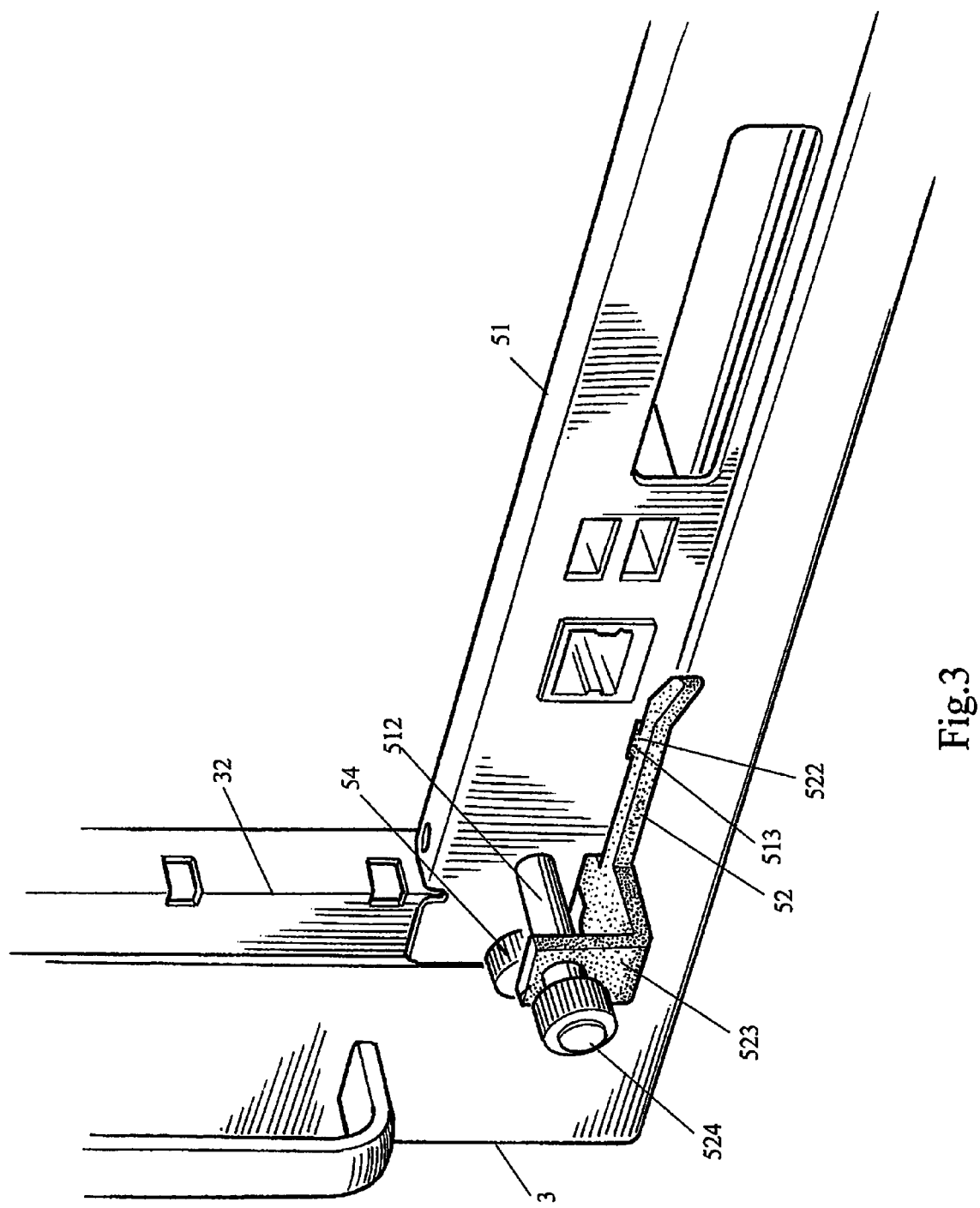
FIG. 3 is a perspective view illustrating a panel device according to the present invention, wherein the arm is coupled with the switch.

As shown in FIGS. 2 and 3, a panel device 5 according to the present invention for an ATCA main board 2 comprises a faceplate 51, a first arm 52, a second arm 53, and two threaded first fasteners 54.

The faceplate 51 includes two pins 511 respectively provided at two most outer ends of the faceplate 51, a pole 512 installed at one end near the pin 511, two openings 513 situated at the two ends respectively near the pole 512 and the pin 511, and two magnets 514 respectively placed at the two ends near the openings 513. The pole 513 has a threaded aperture 515 at the end surface thereof.

The first arm 52 has a first ear 521 and a first finger 522 respectively near two ends of the first arm 52, in addition to a lug 523 perpendicularly extending from near the first ear 521 and a second fastener 524 provided at the lug 523.

The second arm 53, similar to the first arm 52 except the lug 523 and the second fastener 524, has a second ear 531 and a second finger 532 respectively near two ends thereof.

The first arm 52 and the second arm 53 are both made of iron or metal material, and are pivotally connected to the faceplate 51 respectively at two ends of the faceplate 51 by means of a screw or a rivet 516. Next, the two first fasteners 54 are installed to the faceplate 51 respectively near the two pins 511 to complete the assembling of the panel device 5.

Then the panel device 5 is fixed to an ATCA main board 2 by screws, rivets, or equivalent means. Subsequently, the ATCA main board 2 together with the panel device 5 is pushed into a chamber 31 of a case 3. When the panel device 5 is close to the case 3, the first ear 521 and the second ear 531 are respectively touched by two edges 32 of the case 3 so that the first arm 52 and the second arm 53 swivel to the extent that the first finger 522 and the second finger 532 respectively pass through the openings 513 on the faceplate 51 and then are respectively inserted into two switches 21 provided on the main board 2. The magnets 514 can attract the first arm 52 and second arm 524 to help keeping the first finger 522 and the second finger 532 in place.

Figure 1:
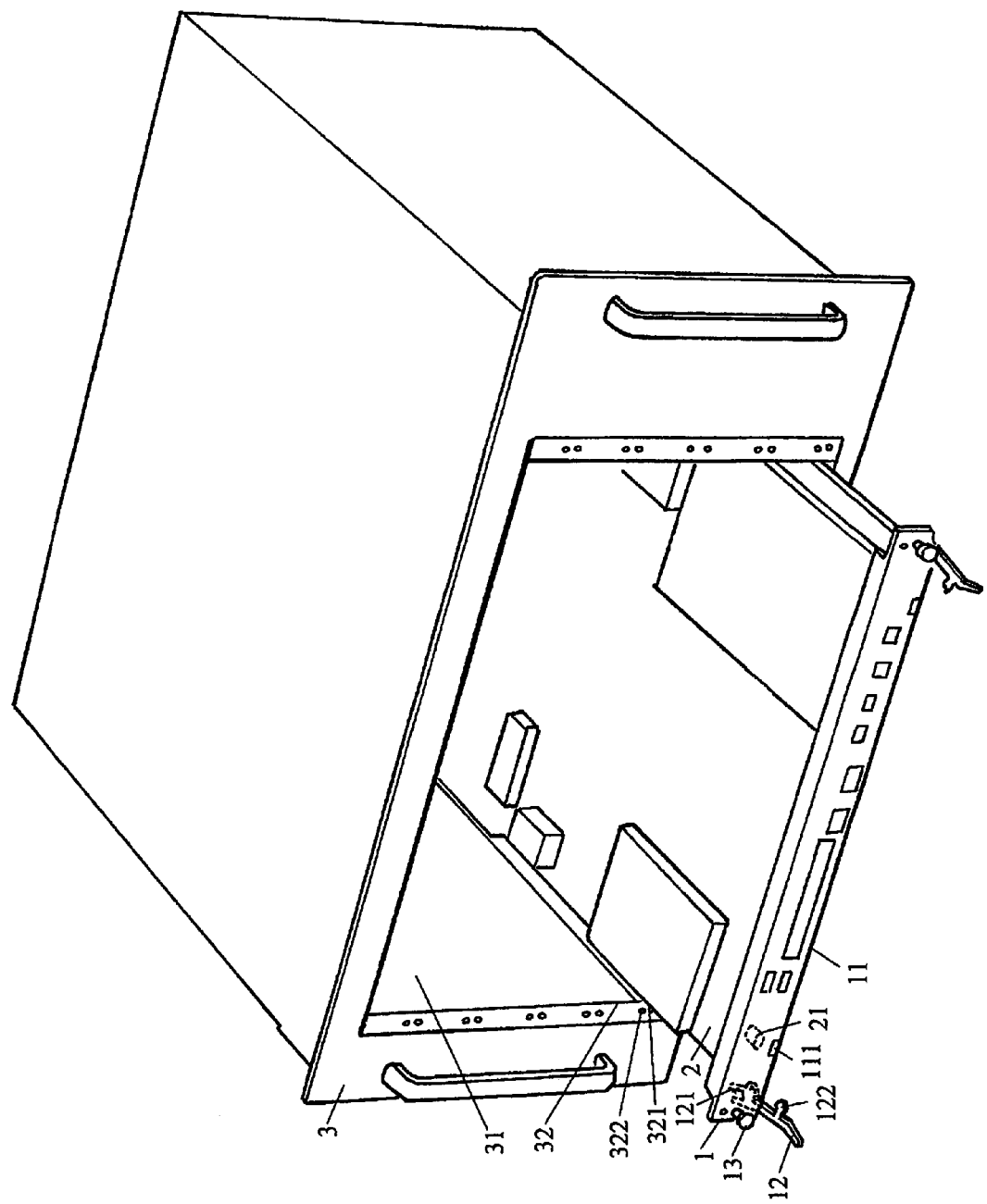
FIG. 1 is a perspective view illustrating a conventional panel device fixed to an ATCA main board which is mounted in a case.

When the ears 521, 531 are respectively touched by two edges 32 of the case 3, the two pins 511 are respectively inserted into two perforations 322 (FIG. 1), near the edges 32, on the case 3 at the same time so as to guide the assembling of the panel device 5 to the case 3. Then the first fasteners 54 are respectively screwed into two threaded holes 321 (FIG. 1), near the edge 32, on the case 3 in order to fix the panel device 5 to the case 3. Finally, the second fastener 524 is screwed into the aperture 515 in the pole 512 so as to fix the first arm 54 to the faceplate 51 and moreover to firmly hold the first finger 522 contacting with the switch 21.

Because the first arm 52 according to the present invention is firmly secured to the faceplate 51 by the second fastener 524 screwed to the pole 512 and the magnet 514 attracting the first arm 52, there is no possibility for the first finger 522 to escape from the switch 21 and hence no mistaken signals will occur to inappropriately shut down the operation in the ATCA main board 2.

Although there is only a switch 21 shown in the above embodiment, however, it can be installed at either side of the main board 2. Therefore, each end of the faceplate may be provided with a set of the first arm 52, pole 512, and opening 513. Besides, the pole 512 can be omitted and then the second fastener 524 is directly screwed into a threaded bore on the faceplate 51.

This invention has been disclosed in terms of specific embodiments. It will be apparent that many modifications can be made to the disclosed structures without departing from the invention. Therefore, it is the intent of the appended claims to cover all such variations and modifications as come within the breadth and scope of this invention.

What is claimed is:

1. A panel device for contacting with a switch on a board in a case, the panel device comprising:
    a faceplate having a pole and two openings;
    two first fasteners for securing the faceplate to the case;
    a first arm pivotally connected to the faceplate, and having a first finger passing through one of the openings to contact with the switch, and having a lug with a second fastener to fix the first arm on the pole; and
    a second arm pivotally connected to the faceplate and having a second finger.

2. The panel device as claimed in claim 1, the first arm further having a first ear for being touched by the case to swivel the first arm in order to make the first finger contact with the switch.

3. The panel device as claimed in claim 1 or 2, wherein the second arm has a second ear passing the other opening.

4. The panel device as claimed in claim 3, the faceplate further having magnets for holding the first arm and the second arm in place.

* * * * *